United States Patent
Cruz-Hernandez et al.

(10) Patent No.: US 7,369,115 B2
(45) Date of Patent: May 6, 2008

(54) HAPTIC DEVICES HAVING MULTIPLE OPERATIONAL MODES INCLUDING AT LEAST ONE RESONANT MODE

(75) Inventors: Juan Manuel Cruz-Hernandez, Montreal (CA); Danny Grant, Montreal (CA); Vincent Hayward, Montreal (CA)

(73) Assignee: Immersion Corporation, San Jose, CA (US)

( * ) Notice: Subject to any disclaimer, the term of this patent is extended or adjusted under 35 U.S.C. 154(b) by 732 days.

(21) Appl. No.: 10/792,279

(22) Filed: Mar. 4, 2004

(65) Prior Publication Data

US 2005/0007342 A1 Jan. 13, 2005

Related U.S. Application Data

(63) Continuation-in-part of application No. 10/301,809, filed on Nov. 22, 2002, now Pat. No. 7,161,580.

(60) Provisional application No. 60/375,930, filed on Apr. 25, 2002.

(51) Int. Cl.
*G09G 5/00* (2006.01)

(52) U.S. Cl. .................... 345/156; 345/161; 345/204; 310/316.01; 310/320; 310/321; 341/20; 367/138

(58) Field of Classification Search ............. 345/156, 345/161, 204; 310/316.01, 320, 321; 341/20; 367/138
See application file for complete search history.

(56) References Cited

U.S. PATENT DOCUMENTS

| | | | |
|---|---|---|---|
| 2,972,140 A | 2/1961 | Hirsch | |
| 3,157,853 A | 11/1964 | Hirsch | |
| 3,220,121 A | 11/1965 | Cutler | |
| 3,497,668 A | 2/1970 | Hirsch | |
| 3,517,446 A | 6/1970 | Corlyon et al. | |
| 3,623,064 A | 11/1971 | Kagan | |
| 3,902,687 A | 9/1975 | Hightower | |
| 3,903,614 A | 9/1975 | Diamond et al. | |
| 3,911,416 A | 10/1975 | Feder | |

(Continued)

FOREIGN PATENT DOCUMENTS

GB 1088741 10/1967

(Continued)

OTHER PUBLICATIONS

Raquet, "Vibration analysis for beams", *Memorandum to MEGR 3152 class*, Chapter 6, pp. 1-12.

(Continued)

*Primary Examiner*—Bipin Shalwala
*Assistant Examiner*—Vincent E. Kovalick
(74) *Attorney, Agent, or Firm*—Thelen Reid Brown Raysman & Steiner LLP (57) ABSTRACT

An apparatus comprises a signal source, a driver and an electro-mechanical transducer. The signal source is configured to output a haptic feedback signal. The driver is configured to receive the haptic feedback signal and output a drive signal. The electro-mechanical transducer is configured to receive the drive signal. The electro-mechanical transducer is configured to have a set of operational modes. Each operational mode from the set of operational modes has at least one resonant mode from a set of resonant modes.

13 Claims, 8 Drawing Sheets

U.S. PATENT DOCUMENTS

| | | |
|---|---|---|
| 3,919,691 A | 11/1975 | Noll |
| 4,127,752 A | 11/1978 | Lowthorp |
| 4,160,508 A | 7/1979 | Salisbury, Jr. |
| 4,236,325 A | 12/1980 | Hall et al. |
| 4,262,240 A | 4/1981 | Arai |
| 4,262,549 A | 4/1981 | Schwellenbach |
| 4,333,070 A | 6/1982 | Barnes |
| 4,334,280 A | 6/1982 | McDonald |
| 4,355,348 A | 10/1982 | Williams |
| 4,382,166 A | 5/1983 | Kim |
| 4,414,984 A | 11/1983 | Zarudiansky |
| 4,459,440 A | 7/1984 | Wiczer |
| 4,464,117 A | 8/1984 | Foerst |
| 4,473,725 A | 9/1984 | Kim |
| 4,484,191 A | 11/1984 | Vavra |
| 4,490,841 A * | 12/1984 | Chaplin et al. .......... 381/71.14 |
| 4,513,235 A | 4/1985 | Acklam et al. |
| 4,581,491 A | 4/1986 | Boothroyd |
| 4,599,070 A | 7/1986 | Hladky et al. |
| 4,600,854 A | 7/1986 | Bednorz et al. |
| 4,706,294 A | 11/1987 | Ouchida |
| 4,708,656 A | 11/1987 | de Vries et al. |
| 4,713,007 A | 12/1987 | Alban |
| 4,731,603 A | 3/1988 | McRae |
| 4,768,412 A | 9/1988 | Sanderson |
| 4,794,392 A | 12/1988 | Selinko |
| 4,795,296 A | 1/1989 | Jau |
| 4,868,549 A | 9/1989 | Affinito et al. |
| 4,885,565 A | 12/1989 | Embach |
| 4,891,764 A | 1/1990 | McIntosh |
| 4,930,770 A | 6/1990 | Baker |
| 4,934,694 A | 6/1990 | McIntosh |
| 5,019,761 A | 5/1991 | Kraft |
| 5,022,384 A | 6/1991 | Freels |
| 5,022,407 A | 6/1991 | Horch et al. |
| 5,035,242 A | 7/1991 | Franklin et al. |
| 5,038,089 A | 8/1991 | Szakaly |
| 5,078,152 A | 1/1992 | Bond et al. |
| 5,103,404 A | 4/1992 | McIntosh |
| 5,107,262 A | 4/1992 | Cadoz |
| 5,146,566 A | 9/1992 | Hollis, Jr. |
| 5,165,897 A | 11/1992 | Johnson |
| 5,172,092 A | 12/1992 | Nguyen et al. |
| 5,175,459 A | 12/1992 | Danial et al. |
| 5,184,310 A | 2/1993 | Takenouchi |
| 5,184,319 A | 2/1993 | Kramer |
| 5,186,629 A | 2/1993 | Rohen |
| 5,186,695 A | 2/1993 | Mangseth et al. |
| 5,203,563 A | 4/1993 | Loper, III |
| 5,212,473 A | 5/1993 | Louis |
| 5,227,594 A | 7/1993 | Russo |
| 5,240,417 A | 8/1993 | Smithson et al. |
| 5,245,245 A | 9/1993 | Goldenberg et al. |
| 5,261,291 A | 11/1993 | Schoch et al. |
| 5,271,290 A | 12/1993 | Fischer |
| 5,275,174 A | 1/1994 | Cook |
| 5,283,970 A | 2/1994 | Aigner |
| 5,296,871 A | 3/1994 | Paley |
| 5,299,810 A | 4/1994 | Pierce et al. |
| 5,309,140 A | 5/1994 | Everett, Jr. et al. |
| 5,334,027 A | 8/1994 | Wherlock |
| 5,354,162 A | 10/1994 | Burdea |
| 5,388,992 A | 2/1995 | Franklin |
| 5,389,849 A | 2/1995 | Asano et al. |
| 5,399,091 A | 3/1995 | Mitsumoto |
| 5,405,152 A | 4/1995 | Katanics |
| 5,435,729 A | 7/1995 | Hildreth et al. |
| 5,436,622 A | 7/1995 | Gutman et al. |
| 5,437,607 A | 8/1995 | Taylor |
| 5,437,608 A | 8/1995 | Cutler |
| 5,438,529 A | 8/1995 | Rosenberg et al. |
| 5,440,183 A | 8/1995 | Denne |
| 5,456,341 A | 10/1995 | Garnjost et al. |
| 5,466,213 A | 11/1995 | Hogan et al. |
| 5,547,382 A | 8/1996 | Yamasaki et al. |
| 5,565,840 A | 10/1996 | Thorner |
| 5,575,761 A | 11/1996 | Hajianpour |
| 5,580,251 A | 12/1996 | Gilkes |
| 5,583,478 A | 12/1996 | Renzi |
| 5,587,937 A | 12/1996 | Massie |
| 5,589,828 A | 12/1996 | Armstrong |
| 5,619,180 A | 4/1997 | Massimino |
| 5,625,575 A | 4/1997 | Goyal et al. |
| 5,631,861 A | 5/1997 | Kramer |
| 5,643,087 A | 7/1997 | Marcus |
| 5,650,704 A | 7/1997 | Pratt et al. |
| 5,661,446 A | 8/1997 | Anderson |
| 5,669,818 A | 9/1997 | Thorner |
| 5,684,722 A | 11/1997 | Thorner |
| 5,689,285 A | 11/1997 | Asher |
| 5,690,582 A | 11/1997 | Ulrich et al. |
| 5,709,219 A | 1/1998 | Chen |
| 5,714,978 A | 2/1998 | Yamanaka |
| 5,734,236 A | 3/1998 | Motegi |
| 5,734,373 A | 3/1998 | Rosenberg |
| 5,735,280 A * | 4/1998 | Sherman et al. ............... 600/1 |
| 5,736,978 A | 4/1998 | Hasser |
| 5,739,811 A | 4/1998 | Rosenberg |
| 5,742,278 A | 4/1998 | Chen |
| 5,754,023 A | 5/1998 | Roston |
| 5,766,016 A | 6/1998 | Sinclair et al. |
| 5,781,172 A | 7/1998 | Engel |
| 5,784,052 A | 7/1998 | Keyson |
| 5,785,630 A | 7/1998 | Bobick et al. |
| 5,790,108 A | 8/1998 | Salcudean |
| 5,805,140 A | 9/1998 | Rosenberg |
| 5,828,363 A | 10/1998 | Yaniger et al. |
| 5,842,162 A | 11/1998 | Fineberg |
| 5,857,986 A | 1/1999 | Moriyasu |
| 5,889,672 A | 3/1999 | Schuler |
| 5,894,263 A | 4/1999 | Shimakawa et al. |
| 5,897,437 A | 4/1999 | Nishiumi |
| 5,907,212 A * | 5/1999 | Okada ........................ 310/328 |
| 5,914,705 A | 6/1999 | Johnson |
| 5,945,772 A | 8/1999 | Macnak et al. |
| 5,973,670 A | 10/1999 | Barber |
| 5,984,880 A | 11/1999 | Lander |
| 5,986,643 A | 11/1999 | Harvill |
| 6,001,014 A | 12/1999 | Ogata |
| 6,004,134 A | 12/1999 | Marcus |
| 6,020,876 A | 2/2000 | Rosenberg et al. |
| 6,044,646 A | 4/2000 | Silverbrook |
| 6,046,726 A | 4/2000 | Keyson |
| 6,078,126 A | 6/2000 | Rollins et al. |
| 6,088,017 A | 7/2000 | Tremblay |
| 6,088,019 A | 7/2000 | Rosenberg |
| 6,104,158 A | 8/2000 | Jacobus |
| 6,111,577 A | 8/2000 | Zilles et al. |
| 6,160,489 A | 12/2000 | Perry et al. |
| 6,181,318 B1 | 1/2001 | Lim |
| 6,184,868 B1 | 2/2001 | Shahoian |
| 6,198,206 B1 | 3/2001 | Saarmaa |
| 6,211,861 B1 | 4/2001 | Rosenberg |
| 6,216,059 B1 | 4/2001 | Ierymenko |
| 6,232,697 B1 * | 5/2001 | Mizumoto .................. 310/317 |
| 6,256,011 B1 | 7/2001 | Culver |
| 6,275,213 B1 | 8/2001 | Tremblay |
| 6,285,351 B1 | 9/2001 | Chang et al. |
| 6,317,032 B1 | 11/2001 | Oishi |
| 6,414,607 B1 | 7/2002 | Gonring et al. |
| 6,422,941 B1 | 7/2002 | Thorner et al. |
| 6,424,333 B1 | 7/2002 | Tremblay |
| 6,429,849 B1 * | 8/2002 | An et al. .................... 345/161 |
| 6,433,771 B1 | 8/2002 | Yocum et al. |

| | | | |
|---|---|---|---|
| 6,437,771 B1 | 8/2002 | Rosenberg et al. | |
| 6,456,024 B1 | 9/2002 | Schmider et al. | |
| 6,531,998 B1 | 3/2003 | Gordon | |
| 6,585,595 B1 | 7/2003 | Soma | |
| 6,704,001 B1 | 3/2004 | Schena et al. | |
| 6,885,876 B2 | 4/2005 | Aaltonen et al. | |
| 6,963,762 B2 | 11/2005 | Kaaresoja et al. | |
| 7,161,580 B2 * | 1/2007 | Bailey et al. | 345/156 |
| 2001/0026264 A1 | 10/2001 | Rosenberg | |
| 2002/0030663 A1 | 3/2002 | Tierling | |
| 2002/0070638 A1 | 6/2002 | Perkins et al. | |
| 2002/0142701 A1 | 10/2002 | Rosenberg | |
| 2002/0159336 A1 * | 10/2002 | Brown et al. | 367/138 |
| 2003/0006892 A1 | 1/2003 | Church | |
| 2003/0067440 A1 | 4/2003 | Rank | |
| 2003/0076298 A1 | 4/2003 | Rosenberg | |

FOREIGN PATENT DOCUMENTS

| | | |
|---|---|---|
| JP | H2-185278 | 7/1990 |
| JP | H4-8381 | 1/1992 |
| JP | H5-192449 | 8/1993 |
| JP | H7-24147 | 1/1995 |
| WO | WO 9200559 | 1/1992 |
| WO | 92/19018 | 10/1992 |
| WO | WO 0103105 A1 | 1/2001 |
| WO | WO 0113354 A1 | 2/2001 |
| WO | WO 0124158 | 4/2001 |

OTHER PUBLICATIONS

Kashani, "Tuned Mass Dampers and Vibration Absorbers," www.deicon.com, pp. 1-5.
Malatkar, "Nonlinear Vibrations of Cantilever Beams and Plates," *Dissertation submitted to the Faculty of the Virginia Polytechnic Institute and State University in partial fulfillment of the requirements for the degree of Doctor of Philosophy in Engineering Mechanics*, Jul. 3, 2003, pp. 1-112.
Patrick, "Design, Construction, and Testing of a Fingertip Tactile Display for Interaction with Virtual and Remote Environments," *Master of Science Thesis*, MIT, Aug. 1990, archived Nov. 8, 1990.
Calder, "Design of A Force-Feedback Touch-Introducing Actuator For Teleoperator Robot Control," *Bachelor of Science Thesis*, MIT, May 1983, archived Jun. 23, 1983.
Wiker, "Teletouch Display Development: Phase 1 Report," *Technical Report 1230*, Naval Ocean Systems Center, San Diego, Jul. 1988.
Bliss, "Optical-to-Tactile Image Conversion for the Blind," *IEEE Transactions on Man-Machine Systems*, vol. MMS-11, No. 1, Mar. 1970.
Johnson, "Shape-Memory Alloy Tactile Feedback Actuator," *Armstrong Aerospace Medical Research Laboratory*, AAMRL-TR-90-039, Aug. 1990.
Kontarinis et al., "Tactile Display of Vibratory Information in Teleoperation and Virtual Environments," Presence, 4(4):387-402, Harvard Univ., 1995.
Aukstakalnis et al., "Silicon Mirage: The Art and Science of Virtual Reality," ISBN 0-938151-82-7, pp. 129-180, 1992.
Eberhardt et al., "Inducing Dynamic Haptic Perception by The Hand: System Description and Some Results," DSC-vol. 55-1, *Dynamic Systems and Control:* vol. 1, ASME 1994.
Gobel et al., "Tactile Feedback Applied to Computer Mice," *International Journal of Human-Computer Interaction*, vol. 7, No. 1, pp. 1-24, 1995.
Pimentel et al., "Virtual Reality: through the new looking glass," 2nd Edition; McGraw-Hill, ISBN 0-07-050167-X, pp. 41-202, 1994.
"Cyberman Technical Specification," *Logitech Cyberman Swift Supplement to Logitech Mouse Technical Reference and Programming Guide*, Apr. 5, 1994.
Ouhyoung et al., "The Development of A Low-Cost Force Feedback Joystick and Its Use in the Virtual Reality Environment," *Proceedings of the Third Pacific Conference on Computer Graphics and Applications, Pacific Graphics '95*, Seoul, Korea, Aug. 21-24, 1995.
Kaczmarek et al., "Tactile Displays," *Virtual Environment Technologies*, Chap. 9, pp. 349-414.
Lake, "Cyberman from Logitech," at http://www.ibiblio.org/GameBytes/issue21/greviews/cyberman.html, 1994.
"Component Maintenance Manual With Illustrated Parts List, Coaxial Control Shaker Part No. C-25502," Safe Flight Instrument Corporation, Revised Jan. 28, 2002 (3 pages).
"Technical Manual Overhaul Instructions With Parts Breakdown, Coaxial Control Shaker Part No. C-25502," Safe Flight Instrument Corporation, Revised Jul. 15, 1980 (23 pages).
Scannell, "Taking a Joystick Ride," *Computer Currents*, Boston Edition, vol. 9, No. 11, Nov. 1994.
Yamakita et al., "Tele-Virtual Reality of Dynamic Mechanical Model," *Proceedings of the 1992 IEEE/RSJ International Conference on Intelligent Robots and Systems*, Raleigh, NC, Jul. 7-10, 1992.
Noll, "Man-Machine Tactile," *SID Journal*, Jul./Aug. 1972 Issue.
Rosenberg, "Virtual Fixtures: Perceptual Overlays Enhance Operator Performance in Telepresence Tasks," *Ph.D. Dissertation*, Stanford University, Jun. 1994.
Baigrie, "Electric Control Loading—A Low Cost, High Performance Alternative," *Proceedings of Interservice/Industry Training Systems Conference*, pp. 247-254, Nov. 6-8, 1990.
Iwata, "Pen-based Haptic Virtual Environment," 0-7803-1363-1/93 IEEE, pp. 287-292, 1993.
Russo, "The Design and Implementation of a Three Degree of Freedom Force Output Joystick," *MIT Libraries Archives* pp. 1-131, May 1990, archived Aug. 14, 1990.
Brooks et al., "Hand Controllers for Teleoperation—A State-of-the-Art Technology Survey and Evaluation," *JPL Publication 85-11*, NASA-CR-175890; N85-28559, pp. 1-84, Mar. 1, 1985.
Jones et al., "A perceptual analysis of stiffness," ISSN 0014-4819 Springer International (Springer-Verlag); *Experimental Brain Research*, vol. 79, No. 1, pp. 150-156, 1990.
Burdea et al., "Distributed Virtual Force Feedback, Lecture Notes for Workshop on Force Display in Virtual Environments and its Application to Robotic Teleoperation," *1993 IEEE International Conference on Robotics and Automation*, pp. 25-44, May 2, 1993.
Snow et al., Model-X Force-Reflecting-Hand-Controller, NT Control No. NPO-17851; JPL Case No. 7348, pp. 1-4 with 45 pages of attachments, Jun. 15, 1989.
Ouh-Young, "Force Display in Molecular Docking," Doctoral Dissertation, University of North Carolina at Chapel Hill, UMI Order No. 9034744, p. 1-369, 1990.
Tadros, "Control System Design for a Three Degree of Freedom Virtual Environment Simulator Using Motor/Brake Pair Actuators," *MIT Archive*, pp. 1-88, Feb. 1990, archived Aug. 13, 1990.
Caldwell et al., "Enhanced Tactile Feedback (Tele-Taction) Using a Multi-Functional Sensory System," 1050-4729/93, pp. 955-960, 1993.
Adelstein et al., "Design and Implementation of a Force Reflecting Manipulandum for Manual Control research," DSC-vol. 42, *Advances in Robotics*, pp. 1-12, 1992.
Gotow et al., "Controlled Impedance Test Apparatus for Studying Human Interpretation of Kinesthetic Feedback," WA11-11:00, pp. 332-337.
Stanley et al., "Computer Simulation of Interacting Dynamic Mechanical Systems Using Distributed Memory Parallel Processors," DSC-vol. 42, *Advances in Robotics*, pp. 55-61, ASME 1992.
Russo, "Controlling Dissipative Magnetic Particle Brakes in Force Reflective Devices," DSC-vol. 42, *Advances in Robotics*, pp. 63-70, ASME 1992.
Kontarinis et al., "Display of High-Frequency Tactile Information to Teleoperators," *Telemanipulator Technology and Space Telerobotics*, Won S. Kim, Editor, Proc. SPIE vol. 2057, pp. 40-50, Sep. 7-9, 1993.
Patrick et al., "Design and Testing of A Non-reactive, Fingertip, Tactile Display for Interaction with Remote Environments," *Cooperative Intelligent Robotics in Space*, Rui J. deFigueiredo et al, Editor, Proc. SPIE vol. 1387, pp. 215-222, 1990.
Adelstein, "A Virtual Environment System For The Study of Human Arm Tremor," *Ph.D. Dissertation*, Dept. of Mechanical Engineering, MIT, Jun. 1989, archived Mar. 13, 1990.

Bejczy, "Sensors, Controls, and Man-Machine Interface for Advanced Teleoperation," *Science*, vol. 208, No. 4450, pp. 1327-1335, 1980.

Bejczy et al., "Generalization of Bilateral Force-Reflecting Control of Manipulators," *Proceedings Of Fourth CISM-IFToMM*, Sep. 8-12, 1981.

McAffee et al., "Teleoperator Subsystem/Telerobot Demonstrator: Force Reflecting Hand Controller Equipment Manual," *JPL* 1988, JPL D-5172.

Minsky, "Computational Haptics: The Sandpaper System for Synthesizing Texture for a Force-Feedback Display," *Ph.D Dissertation*, MIT, Jun. 1995, archived Jul. 6, 1995.

Jacobsen et al., "High Performance, Dextrous Telerobotic Manipulator With Force Reflection," *Intervention/ROV '91 Conference & Exposition*, Hollywood, Florida, May 21-23, 1991.

Shimoga, "Finger Force and Touch Feedback Issues in Dexterous Telemanipulation," *Proceedings of Fourth Annual Conference on Intelligent Robotic Systems for Space Exploration*, Rensselaer Polytechnic Institute, Sep. 30-Oct. 1, 1992.

IBM Technical Disclosure Bulletin, "Mouse Ball-Actuating Device With Force and Tactile Feedback," vol. 32, No. 9B, Feb. 1990.

Terry et al., "Tactile Feedback In A Computer Mouse," *Proceedings of Fourteenth Annual Northeast Bioengineering Conference*, University of New Hampshire, Mar. 10-11, 1988.

Howe, "A Force-Reflecting Teleoperated Hand System for the Study of Tactile Sensing in Precision Manipulation," *Proceedings of the 1992 IEEE International Conference on Robotics and Automation*, Nice, France, May 1992.

Eberhardt et al., "OMAR—A Haptic display for speech perception by deaf and deaf-blind individuals," *IEEE Virtual Reality Annual international Symposium*, Seattle, WA, Sep. 18-22, 1993.

Rabinowitz et al., "Multidimensional tactile displays: Identification of vibratory Intensity, frequency, and contractor area," *Journal of The Acoustical Society of America*, vol. 82, No. 4, Oct. 1987.

Bejczy et al., "Kinesthetic Coupling Between Operator and Remote Manipulator," *International Computer Technology Conference, The American Society of Mechanical Engineers*, San Francisco, CA, Aug. 12-15, 1980.

Bejczy et al., "A Laboratory Breadboard System For Dual-Arm Teleoperation," *SOAR '89 Workshop, JSC*, Houston, TX, Jul. 25-27, 1989.

Ouhyoung et al., "A Low-Cost Force Feedback Joystick and Its Use in PC Video Games," *IEEE Transactions on Consumer Electronics*, vol. 41, No. 3, Aug. 1995.

Marcus, "Touch Feedback in Surgery," *Proceedings of Virtual Reality and Medicine The Cutting Edge*, Sep. 8-11, 1994.

Bejczy, et al., "Universal Computer Control System (UCCS) For Space Telerobots," CH2413-3/87/0000/0318501.00 1987 IEEE, 1987.

Patent Abstracts of Japan, application No. 59152667, publication No. 61032487, publication date Feb. 15, 1986, applicant Nippon Telegr & Teleph Corp.

International Search Report for international application PCT/US2005/007215, date of mailing Jun. 28, 2005.

Jackson, K. M., "Linearity of Radio-Frequency Transducers," Med. & Biol. Eng. and Computer, Jul. 1977, 15, pp. 446-449.

Voyles, Richard M. et al., "Design of a Modular Tactile Sensor and Actuator Based on an Electrorheological Gel," Proceedings of the 1996 IEEE International Conference on Robotics and Automation, Apr. 1996, pp. 13-17.

Kashani, R., "Tuned Mass Dampers and Vibration Absorbers," www.deicon.com, pp. 1-5.

Malatakar, P., "Nonlinear Vibrations of Cantilever Beams and Plates", Blacksburg, Virgina, Jul. 3, 2003, 145 pp.

* cited by examiner

HAPTIC DEVICES HAVING MULTIPLE OPERATIONAL MODES INCLUDING AT LEAST ONE RESONANT MODE

CROSS-REFERENCE TO RELATED PATENT APPLICATIONS

This application is a continuation-in-part and claims priority to U.S. patent application Ser. No. 10/301,809, entitled "Haptic Feedback Using Rotary Harmonic Moving Mass" and filed Nov. 22, 2002; now U.S. Pat. No. 7,161,580 and U.S. patent application Ser. No. 60/375,930, entitled "Haptic Feedback Using Rotary Harmonic Moving Mass" and filed Apr. 25, 2002; the disclosure of both being incorporated by reference.

FIELD OF THE INVENTION

The invention relates generally to the application of vibrotactile feedback. More particularly, the invention relates to a haptic feedback device having multiple operational modes including multiple resonant modes.

BACKGROUND OF THE INVENTION

Generally, electro-mechanical transducers exhibit a level of power consumption that may be higher than desired. Furthermore, such electro-mechanical transducers may not be able to produce haptic feedback of a desired magnitude or bandwidth due to space constraints.

What is needed is an electro-mechanical transducer that is configured to produce vibrotactile feedback having a relatively high magnitude and/or an adjustable bandwidth. Additionally, it would be desirable to have an electro-mechanical transducer that can generate haptic feedback having relatively low energy consumption.

SUMMARY OF THE INVENTION

An apparatus comprises a signal source, a driver and an electro-mechanical transducer. The signal source is configured to output a haptic feedback signal. The driver is configured to receive the haptic feedback signal and output a drive signal. The electro-mechanical transducer is configured to receive the drive signal. The electro-mechanical transducer is configured to have a set of operational modes. Each operational mode from the set of operational modes has at least one resonant mode from a set of resonant modes.

DETAILED DESCRIPTION

An apparatus comprises a signal source, a driver and an electro-mechanical transducer having a cantilever. The signal source is configured to output a haptic feedback signal. The driver is configured to receive the haptic feedback signal and output a drive signal. The electro-mechanical transducer has a cantilever and is configured to receive the drive signal. The electro-mechanical transducer is configured to have a set of operational modes. Each operational mode from the set of operational modes has at least one resonant mode from a set of resonant modes.

In one embodiment, electro-mechanical devices are used in an electro-mechanical transducer that is configured to output haptic feedback in an operational mode having one or more resonant modes. The electro-mechanical transducer is also configured to have multiple operational modes. Such a device can produce diverse and robust haptic feedback that can exhibit relatively low power consumption in a space-efficient manner. Although many embodiments described herein relate to using cantilevers as resonant structures, analogous devices are also possible. For example, such resonant structures can use acoustic cavities, membranes, mass-springs, wheel-torsional springs, and/or other structures capable of exhibiting mechanical resonance. Some embodiment, for example, can have a combination of different types of structure capable of exhibiting mechanical resonance.

As used herein, the term "operational mode" means a method or manner of functioning in a particular condition at a given time. For example, if a first electro-mechanical device is operating in a first resonant mode and a second electro-mechanical device is operating in a second resonant mode, the electro-mechanical transducer is operating collectively in, for example, a first operational mode. Alternatively, for example, if the first electro-mechanical device is operating in a third resonant mode, and the second electro-mechanical device is operating in a fourth resonant mode, the electro-mechanical transducer is operating collectively in a second operational mode. In another example, if the first electro-mechanical device is operating in a first resonant mode, and the second electro-mechanical device is not operating, the electro-mechanical transducer is operating collectively in a third operational mode. In other words, a given operation mode can be based on one electro-mechanical device operating in a resonant mode and another electro-mechanical device not being activated.

The term "resonant mode" means any mode of an electro-mechanical device operating in a frequency band centered around a resonant frequency. When an electro-mechanical device operates at or near a resonant frequency, several consequences occur. For example, when a transducer operates at or near a resonant frequency, the inertial term and the elastic terms substantially cancel. The power consumed by the actuator is then dedicated to balance dissipation (e.g. damping). If the dissipation is low, for example, in a cantilevered piezo-electric beam (i.e. a resonator with a high Q factor), the displacement is relatively large and limited by dissipative forces. In addition, if the mass that resonates is comparable to the mass of the structure to which the transducer is attached (e.g. case of a telephone), then the structure vibrates with a relatively large magnitude. Power lost during activation is in the dissipation. The remaining power is transmitted to the anatomy of the person with which the device is in contact.

The term "electro-mechanical device" as used herein, means an individual active component configured to provide haptic feedback. The term "active component" refers to a single component that provides a mechanical response to the application of an electrical signal. For example, for the embodiment illustrated in FIG. 5 and discussed below, a single length of, for example, piezoelectric material (for example, piezoelectric bar 410) and the associated mass (for example, mass 412) is referred to herein as the electro-mechanical device. In the example illustrated in FIG. 8 and discussed below, the electro-mechanical transducer includes only one electro-mechanical device.

The term "electro-mechanical transducer" means an apparatus having one or more electro-mechanical devices coupled to a mechanical ground. For example, in the embodiment of the invention illustrated in FIG. 5, the electro-mechanical transducer includes all three lengths of piezoelectric material, each having a mass coupled thereto. In the embodiment illustrated in FIG. 8, the electro-mechanical transducer includes piezoelectric bar 610 and the masses 620, 630, and 640.

Figure 1:
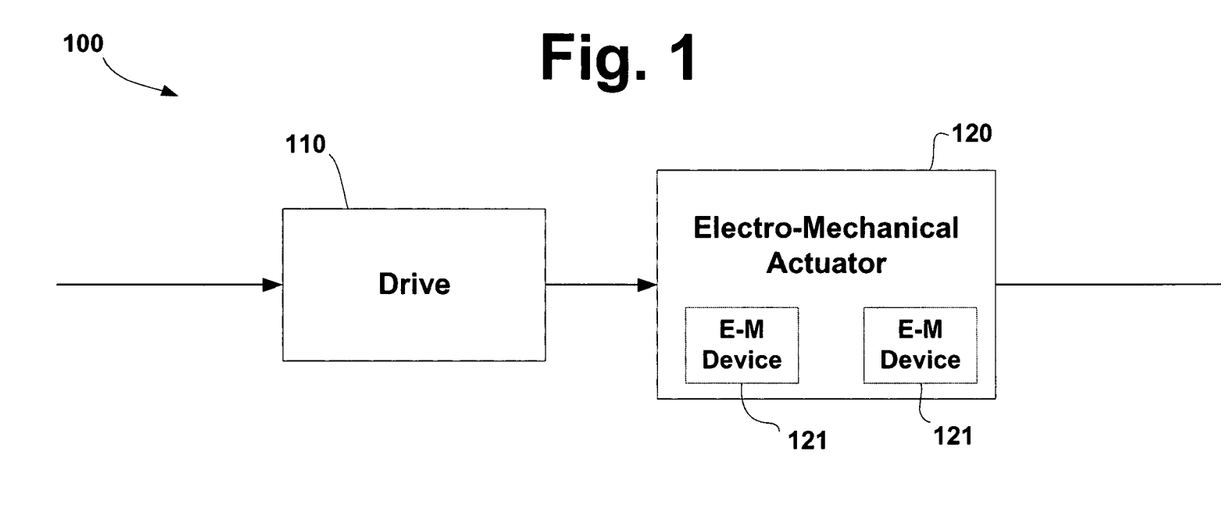
FIG. 1 is a system block diagram of an electro-mechanical transducer, according to an embodiment of the invention.

An embodiment of an electro-mechanical transducer is illustrated in FIG. 1. An electro-mechanical transducer according to this embodiment of the invention includes a drive circuit 110 having an amplifier and includes an electro-mechanical transducer 120. The electro-mechanical transducer 120 includes one or more electro-mechanical (E-M) devices 121.

Figure 7:
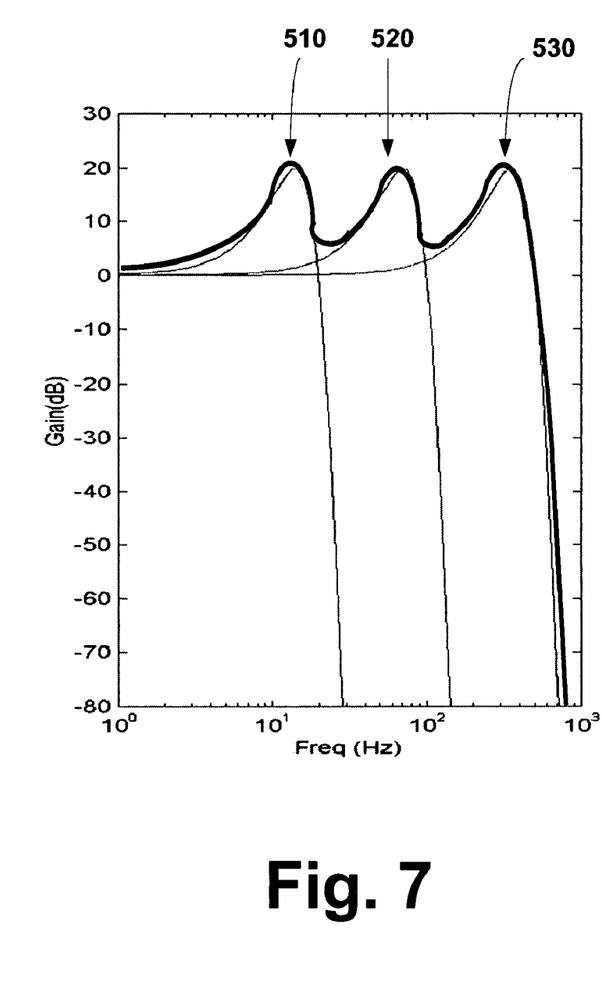
FIG. 7 illustrates a plot of a gain profile for multiple resonant modes output by an electro-mechanical transducer according to an embodiment of the invention.

Drive 110 receives a haptic feedback signal and outputs a drive signal to electro-mechanical transducer 120. The haptic feedback signal may be based on a command from a microprocessor within, for example, a computer or a portable communications device (not shown). The electro-mechanical transducer 120 is configured to selectively operate in one of multiple possible operational modes at a given time. The operational mode of the electro-mechanical transducer 120 at a given time will depend, for example, on the characteristics of the drive signal received from driver 10. For a given operational mode, an electro-mechanical transducer can operate in multiple resonant modes as will be described in greater detail below. The one or more electro-mechanical devices 121 of electro-mechanical transducer 120 collectively output haptic feedback based on the drive signal, as illustrated in FIG. 7.

Figure 2:
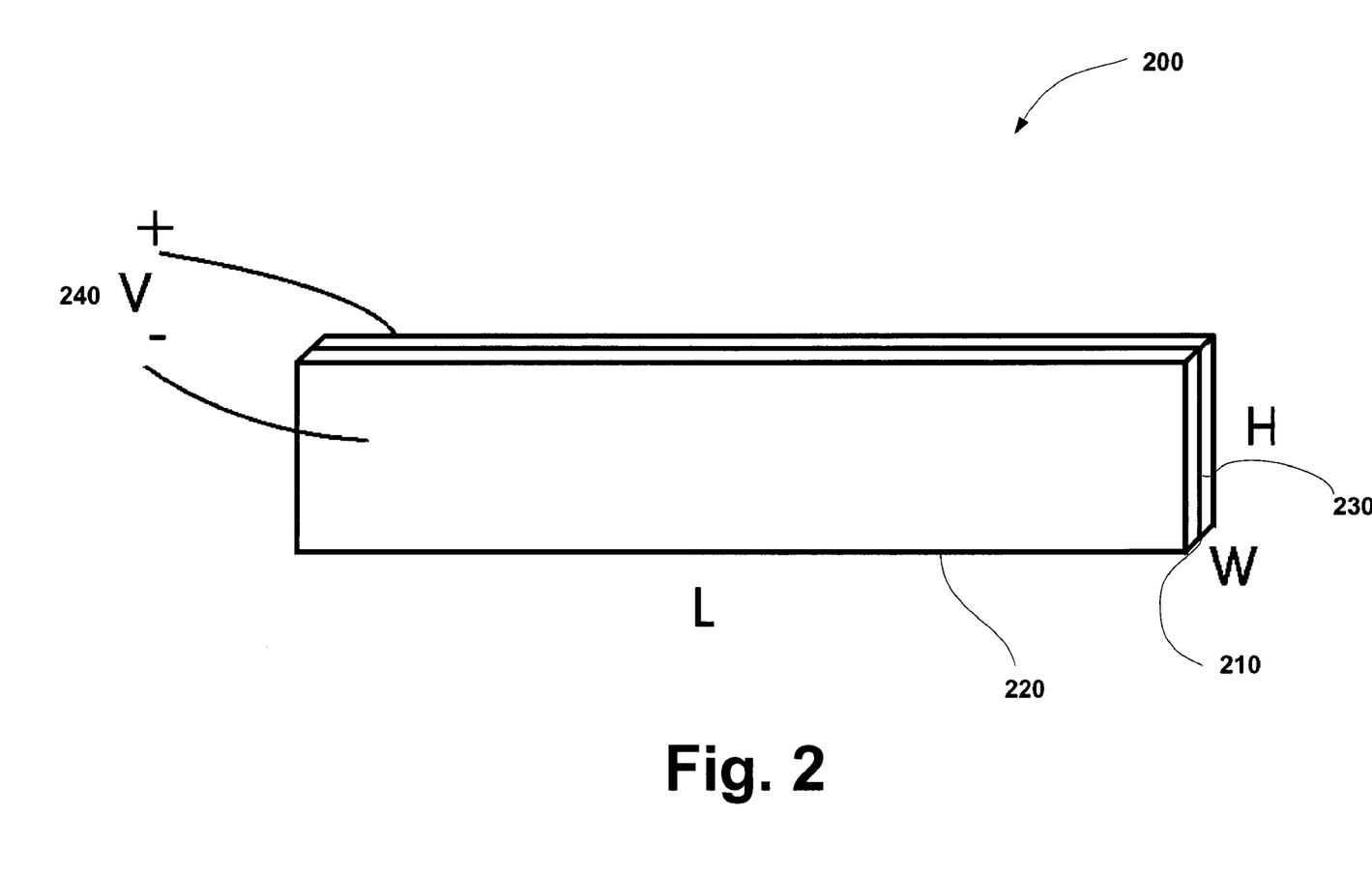
FIG. 2 shows a perspective view of an electro-mechanical device according to an embodiment of the invention.

FIG. 2 illustrates a piezoelectric bar in accordance with one embodiment of the invention. As described below in more detail, such a piezoelectric bar can be used as an electromechanical device within an electro-mechanical transducer.

The piezoelectric bar 200 is a bimorph piezoelectric device that is a two-layer bending motor having a length (L) 220 substantially larger than a width (W) 210. In one embodiment, the piezoelectric bar 200 has a width (W) 210 of approximately 0.6 mm, a length (L) 220 of approximately 25 mm and a height (H) 230 of approximately 5 mm. Alternatively, the piezoelectric bar can have any suitable dimensions depending on the desired use.

When a voltage 240 from, for example, a drive source (not shown), is applied across the piezoelectric bar 200, the piezoelectric bar 200 will flex. An appropriate level of voltage 240 to be applied to the piezoelectric bar 200 can be selected, based at least in part, on the material and the thickness of the material used to construct the piezoelectric bar 200.

The piezoelectric bar 200 can be driven near a resonant frequency. When the piezoelectric bar 200 is driven near a resonant frequency, impedance transformation may be obtained. Impedance transformation results in large mechanical displacements as described above.

Figure 3:
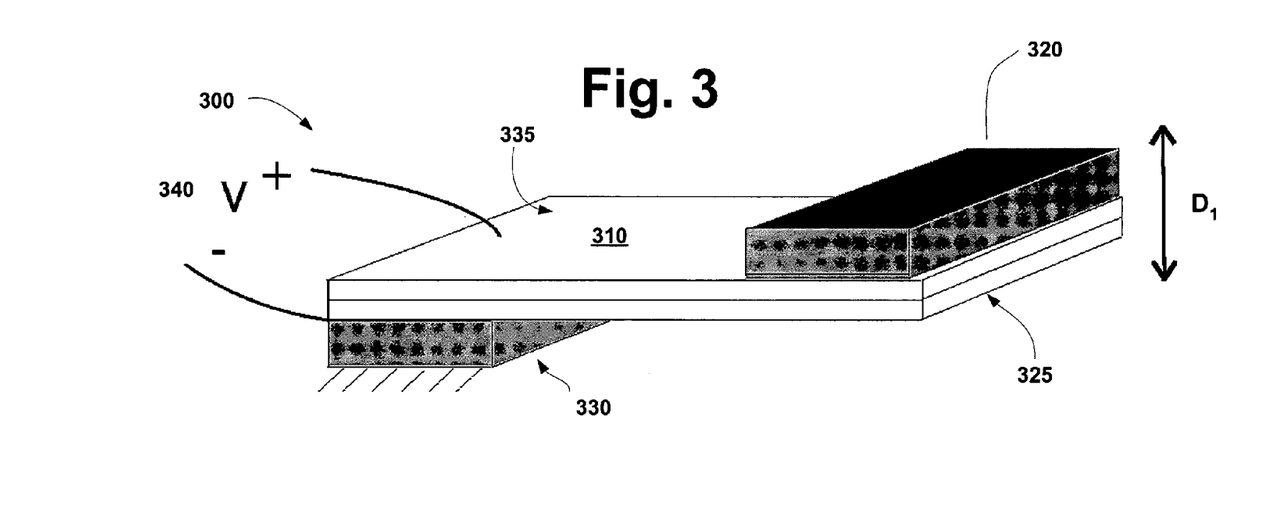
FIG. 3 shows a perspective view of an electro-mechanical transducer according to an embodiment of the invention.

An electro-mechanical device 300 that can be used in combination with other electro-mechanical devices to construct an electro-mechanical transducer is illustrated as FIG. 3. Multiple electro-mechanical devices 300 can be configured to operate in a selected operational mode from a set of possible operational modes, each operational mode having one or more resonant modes, as will be described in further detail with respect to FIG. 5.

The electro-mechanical device 300 illustrated in FIG. 3 includes a piezoelectric bar 310 having mass 320 coupled to an end portion 325 of the piezoelectric bar 310. A second end portion 335 of the piezoelectric bar 310 is coupled to a base member 330. Base member 330 acts as a mechanical ground and is configured to remain stationary relative to the movement of the piezoelectric bar 310.

The electro-mechanical device illustrated in FIG. 3 can operate as follows. A voltage 340 from a voltage source (not shown) can be applied to piezoelectric bar 310. The piezoelectric bar can be, for example, a bimorph piezoelectric device as described above in connection with FIG. 2. Voltage 340 causes piezoelectric bar 310 to flex in a first direction $D_1$. Voltage 340 can be modulated at a frequency, $f_d$, which is referred to herein as the drive frequency of the electro-mechanical device 300. As described above, the frequency $f_d$ can be selected such that the electro-mechanical device 300 operates near a resonant frequency the electro-mechanical device 300. Frequency $f_d$ is a function of the type of electro-mechanical device used in the electro-mechanical transducer, the dimensions of the electro-mechanical device (e.g., the length, width, height or thickness), and the position and weight of the masses in the electro-mechanical device.

When the drive frequency $f_d$ of the voltage 340 is such that the electro-mechanical device 300 operates near its resonant frequency, the electro-mechanical device 300 can produce a large vibration sensation relative to the voltage 340 applied to the electro-mechanical device 300.

Both the weight of mass 320 and the length of the piezoelectric bar 310 affect the amplitude of the displacement. Furthermore, the weight of mass 320 and the length of the piezoelectric bar 310 affect the resonant frequencies of the electro-mechanical device 300. Therefore, the particular resonant frequencies may be tailored by selecting the appropriate length of the piezoelectric bar and/or weight of the mass 320 for a desired resonant frequency. When voltage 340 is applied to the piezoelectric bar 310, the electro-mechanical device 300 will move in a plane oriented as vertical for the depiction in FIG. 3.

Figure 4:
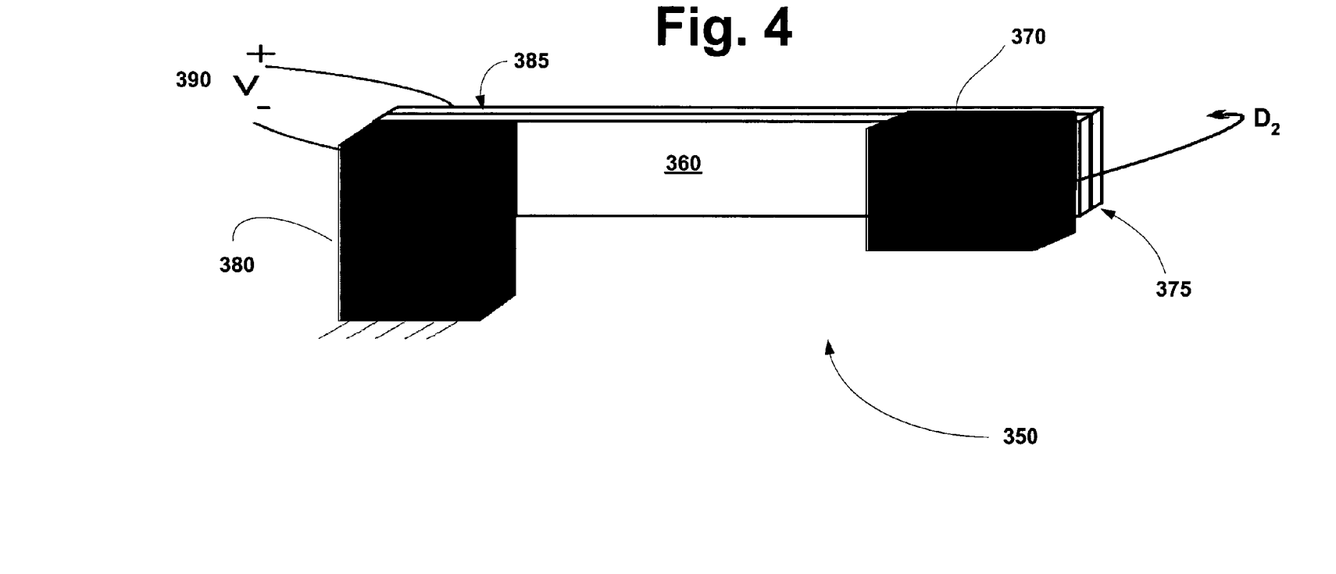
FIG. 4 shows a perspective view of an electro-mechanical transducer according to another embodiment of the invention.

The embodiment illustrated in FIG. 4 is similar to that illustrated in FIG. 3. FIG. 4 shows an electro-mechanical device 350 including a piezoelectric bar 360 having mass 370 coupled to an end portion 375 of piezoelectric bar 360. The piezoelectric bar 360 has its second end portion 385 coupled to a base member 380, which acts as a ground and is configured to remain stationary with respect to movement of the piezoelectric bar 360.

The operation of the electro-mechanical device 350 is similar to the embodiment described with reference to FIG. 3 except that when voltage 390 is applied to piezoelectric bar 360, the electro-mechanical device 350 will vibrate in direction $D_2$ (i.e., relative to the perspective shown in FIG. 4) due to the orientation of the bimorph piezoelectric bar 360 relative to base member 380.

Figure 5:
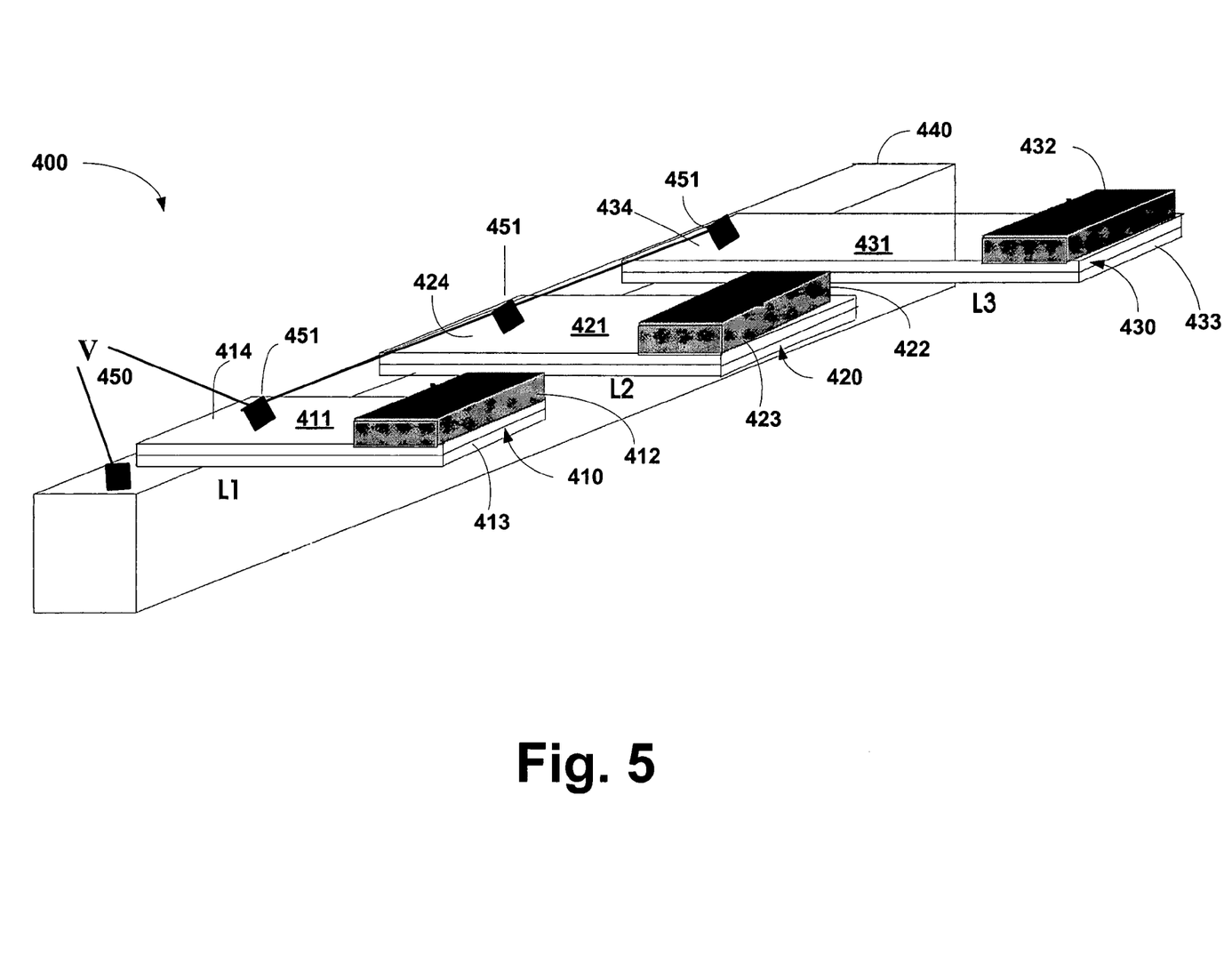
FIG. 5 shows a perspective view of an electro-mechanical transducer in a parallel arrangement, according to an embodiment of the invention.

FIG. 5 illustrates an electro-mechanical transducer 400, according to another embodiment of the invention. The electro-mechanical transducer 400 includes three electro-mechanical devices 410, 420, and 430. In the illustrated embodiment, each of the electro-mechanical devices 410, 420 and 430 includes a piezoelectric bar 411, 421, and 431, respectively. A mass 412, 422, and 432 can be coupled to an end portion 413, 423, or 433, of each piezoelectric bar 411, 421 and 431, respectively. The second end portion 414, 424, and 434, of each piezoelectric bar 411, 421, and 431, respectively, is coupled to a base member 440. Base member 440 can be configured to remain stationary with respect to movement of the piezoelectric bars 411, 421 and 431. More specifically, base member 440 is stationary relative to any movement of piezoelectric bars 411, 421 and 431, but can move in the context of the overall product or device (e.g., mobile phone, game controller, etc.) with which the electro-mechanical device 400 is disposed. In fact, base member 440 can relay the vibrations produced by the movement of piezoelectric bars 411, 421 and 431 to the product or device. Base member 440 may be a single contiguous mechanical ground, as illustrated in FIG. 5. Alternatively, each piezoelectric bar 411, 421, and 431 may be coupled to a different mechanical ground.

Piezoelectric bars 411, 421, and 431 have lengths L1, L2, and L3, respectively. In one embodiment, these lengths may be the same. Alternatively, lengths L1, L2, and L3 can be different. Additionally, the weights of masses 412, 422, and 432, can be equal to one another. Alternatively, weights of the masses 412, 422, and 432 can be different from one another. The particular configuration of the masses 412, 422 and 432 and the lengths of the piezoelectric bars 411, 421, and 431 can be based on the desired frequency response from the electro-mechanical transducer 400.

The operation of the electro-mechanical transducer in FIG. 5 will be described with reference to FIGS. 4 and 5. Voltage 450 can be applied to the electro-mechanical devices through contacts 451. The voltage may by modulated at approximately the resonant frequency of the electro-mechanical devices 410, 420, and/or 430. The voltage may be applied by a single voltage source via contacts 451, or alternatively, each electro-mechanical device 410, 420, 430, may have an independent voltage source (not shown) that is modulated approximately at the resonant frequency of the respective electro-mechanical device, or a resonant mode of the respective electro-mechanical device. Alternatively, voltage 450 may be modulated at a higher order resonant frequency of the electro-mechanical devices 410, 420, and/or 430.

Figure 6:
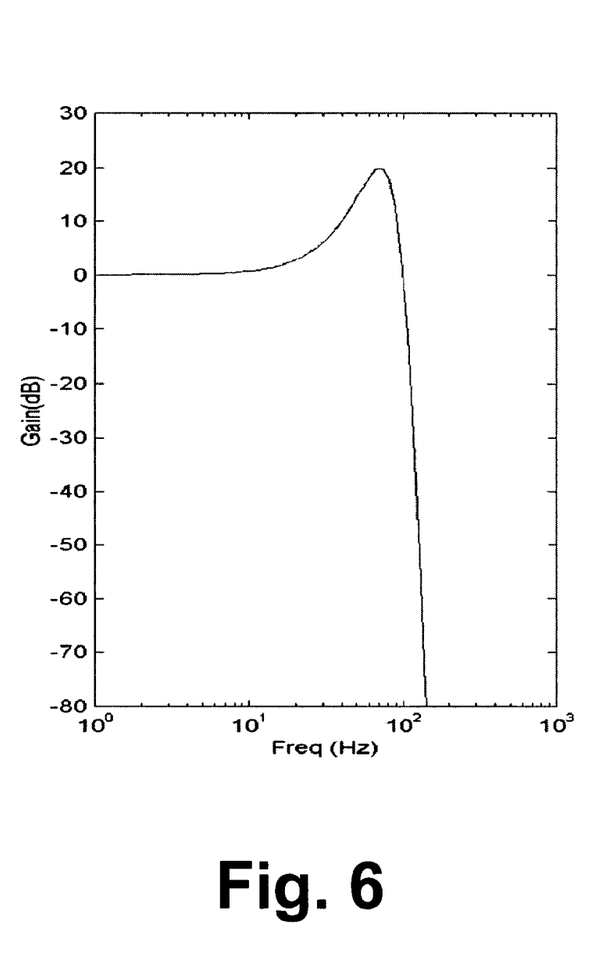
FIG. 6 illustrates a plot of a gain profile for a single resonant mode output from single electro-mechanical transducer according to one embodiment of the invention.

In an alternative arrangement, the electro-mechanical transducer 400 can include electro-mechanical devices 410, 420, and 430 that have different lengths L1, L2, L3. In this arrangement, each of the electro-mechanical devices 410, 420, and 430 has a different resonant frequency $f_1$, $f_2$, and $f_3$, respectively. These different resonant frequencies can be driven at different drive frequencies $f_{d1}$, $f_{d2}$, and $f_{d3}$. An example of the frequency response for an electro-mechanical transducer 400 is illustrated in FIG. 7. As depicted in the plot in FIG. 7, an electro-mechanical transducer with three electro-mechanical devices each operating at a different resonant frequency (or resonants thereof) has a frequency response with a greater bandwidth than the frequency response for an electro-mechanical transducer having a single electro-mechanical device, which is illustrated in FIG. 7. Note that the gain values shown on the y-axes in FIGS. 6 and 7 relate to the magnitude of the device position divided by the magnitude of the input voltage to the device.

In another arrangement, masses 412, 422, and 432 and lengths L1, L2, and L3 of electro-mechanical devices 411, 421, and 431 can be configured such that a single drive frequency, $f_d$, may be used to drive, for example, the resonant mode in electro-mechanical device 411, the first resonant mode in electro-mechanical device 422, and the second resonant mode in electro-mechanical device 432.

In yet another arrangement, the bandwidth of the electro-mechanical transducer 400 may be adjusted by selectively operating one or more of the electro-mechanical devices 410, 420, 430 in different resonant modes. Each one of these combinations of resonant frequencies collectively superpose into a different operational mode of the electro-mechanical transducer 400.

In a first operational mode, for example, the electro-mechanical transducer 400 can be operated such that electro-mechanical devices 410 and 430 may be operating at frequencies $f_1$ and $f_3$, respectively, with $f_1$ and $f_3$ being resonant modes of the electro-mechanical devices 410 and 430, respectively. A voltage need not be applied to electro-mechanical device 420 in this operational mode. In this operational mode, the output of the electro-mechanical transducer 400 would include peaks 510 and 530 illustrated in FIG. 7.

In a second operational mode, for example, the electro-mechanical transducer 400 can be operated such that electro-mechanical devices 410 and 420 are operating at frequencies $f_1$ and $f_2$, respectively, where $f_1$ and $f_2$ are resonant modes of the electro-mechanical devices 410 and 420. In this operational mode, the electro-mechanical transducer 400 can produce an output having only two peaks, as illustrated, for example, in FIG. 7 as 510 and 520. This operational mode can have two frequencies that are different from the two frequencies of the first operational mode described above. Therefore, by changing the operational mode of the electro-mechanical transducer 400, the resultant frequencies of the tactile feedback can be changed.

In a third operational mode, for example, the electro-mechanical transducer 400 can be operated such that electro-mechanical devices 420 and 430 may be operating at frequencies $f_2$ and $f_3$, respectively, where $f_2$ and $f_3$ are resonant modes of each of the electro-mechanical devices 420 and 430. In this operational mode, the electro-mechanical transducer 400 can produce an output having only two peaks, as illustrated, for example, in FIG. 7 as 520 and 530. This operational mode can have two frequencies that are different from the two frequencies for first operational mode described above. Additionally, the third operational mode can have two frequencies that are different from the two frequencies of the second operational mode. Therefore, by changing the operational mode of the electro-mechanical transducer 400, the resultant frequencies of the haptic feedback can be changed.

In other operational modes, the electro-mechanical transducer 400 can be operated such that one of electro-mechanical devices 410, 420 and 430 is operating at frequencies $f_1$, $f_2$ and $f_3$, respectively, where $f_1$, $f_2$ and $f_3$ are resonant modes of each of the electro-mechanical devices 410, 420 and 430. In these operational modes, the electro-mechanical transducer 400 can produce an output having only one peak at a time. In other words, operational modes are possible where only a single electro-mechanical device is actuated at a given time.

The voltage can be modulated at a number of different drive frequencies, $f_d$. For example, the drive frequency $f_d$ can approximate a resonant mode of the electro-mechanical devices. Alternatively, $f_d$ can include any other frequency that is an integral multiple of the electro-mechanical device's resonant frequency.

While certain operational modes have been described with reference to FIG. 5, it will be apparent from this discussion that many other operational modes are possible. For example, by providing additional electro-mechanical devices, the number of possible operational modes increases. Additionally, while only three piezoelectric bars were illustrated in FIG. 5, any number of piezoelectric bars may be employed.

Additionally, while the embodiments were described above with reference to electro-mechanical devices that included piezoelectric bars, any electro-active material or device can be used. For example, the electro-mechanical devices can include electro-active polymers (EAP), voice coil transducers or other electromagnetic device, an inertial resonant device, or a resonant eccentric rotating mass (HERM) device. An example of an inertial resonant device is described in co-pending U.S. Pat. No. 6,088,019, which is hereby incorporated by reference in its entirety. An example of a HERM device is described in co-pending patent application Ser. No. 10/301,809, which is hereby incorporated by reference in its entirety.

Figure 8:
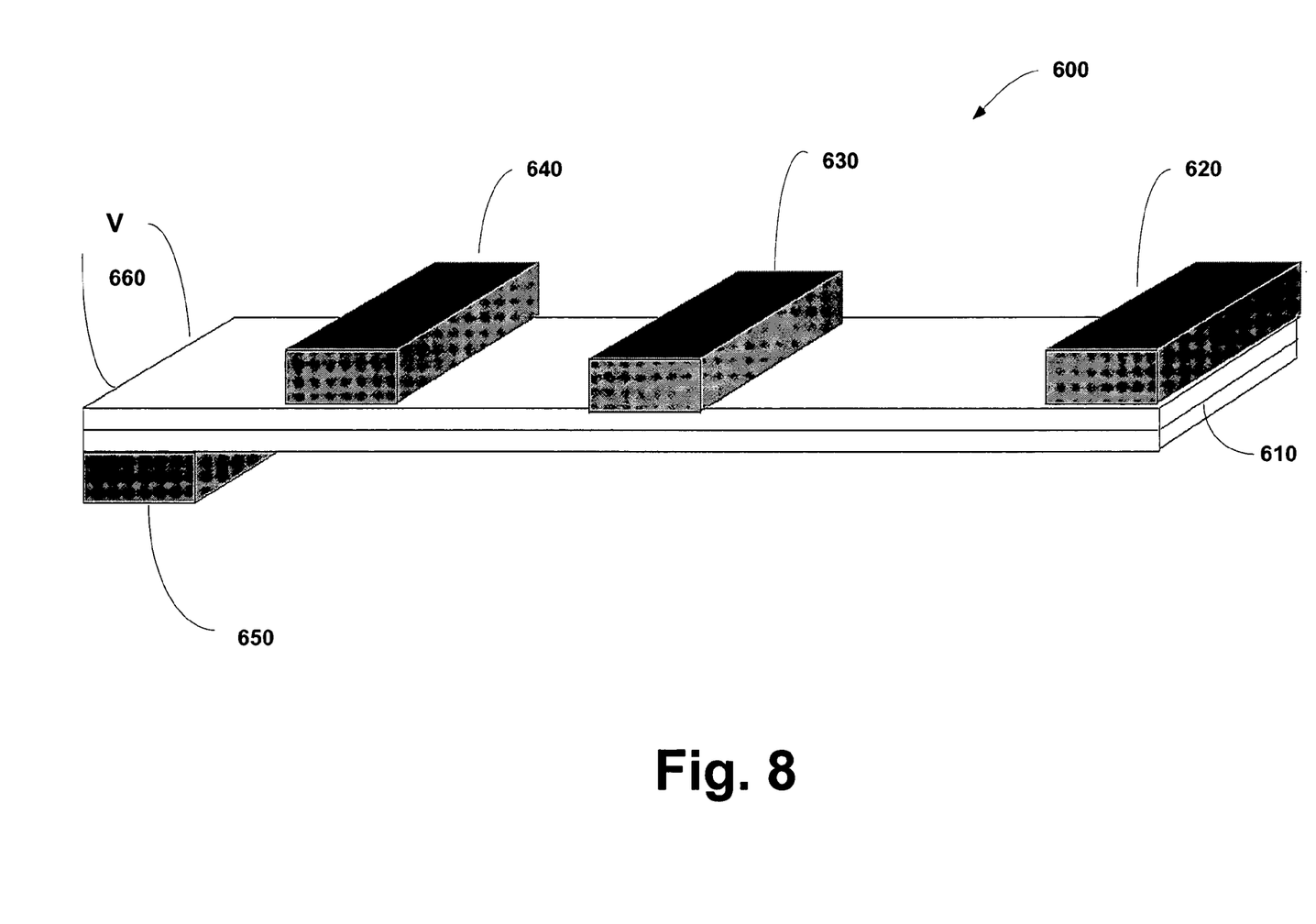
FIG. 8 shows a perspective view of an electro-mechanical transducer in a series arrangement according to another embodiment of the invention.

FIG. 8 illustrates an alternative embodiment of an electro-mechanical transducer 600 having multiple masses 620, 630, and 640 disposed on the same piezoelectric bar 610.

In this embodiment, electro-mechanical transducer 600 comprises one electro-mechanical device, the structure of which corresponds to the structure of electro-mechanical transducer 600. The piezoelectric bar 610 is secured to a base member 650, which acts as a mechanical ground and remains substantially fixed with respect to the movement of the electro-mechanical device 600. Masses 620, 630, and 640 can have equal weights or can have different weights. Alternatively, the weights of the two masses can be equal to one another, while the weight of the third mass can be different. Additionally, the masses 620, 630, and 640 can be equally spaced along the length of the piezoelectric bar 610 or can be spaced at any desired location along the length of the piezoelectric bar 610. The weight of and spacing between masses 620, 630, and 640 allow the electro-mechanical device to be designed to have a predetermined number of resonant frequencies.

Next, the operation of the embodiment illustrated in FIG. 8 will be described with reference to FIGS. 6-10. FIGS. 7-10 illustrate an example of the different operational modes that can be obtained with an electro-mechanical transducer 600 bearing three masses. The bends in the piezoelectric bar 610 are exaggerated in this figure to illustrate the bending of the piezoelectric bar 610 more clearly.

Figure 9:
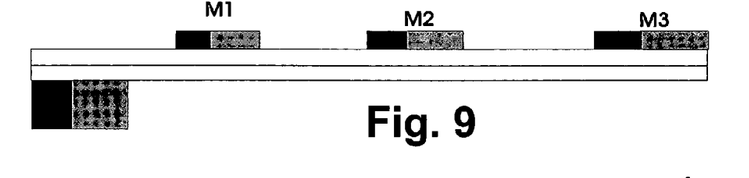
FIG. 9 shows a side view of an electro-mechanical transducer shown in FIG. 8 in a rest position.
Figure 10:
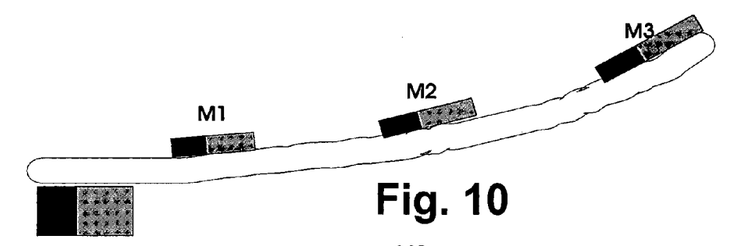
FIG. 10 illustrates the electro-mechanical transducer according to the embodiment depicted in FIG. 8 operating in a first resonant mode.
Figure 11:
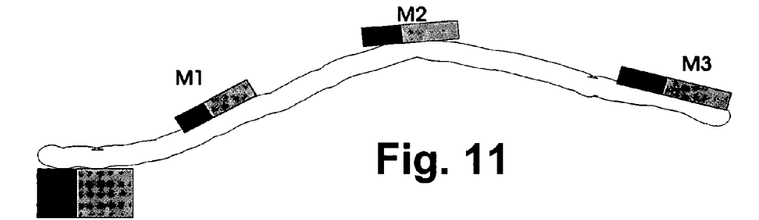
FIG. 11 illustrates the electro-mechanical transducer according to the embodiment depicted in FIG. 8 operating in a second resonant mode.
Figure 12:
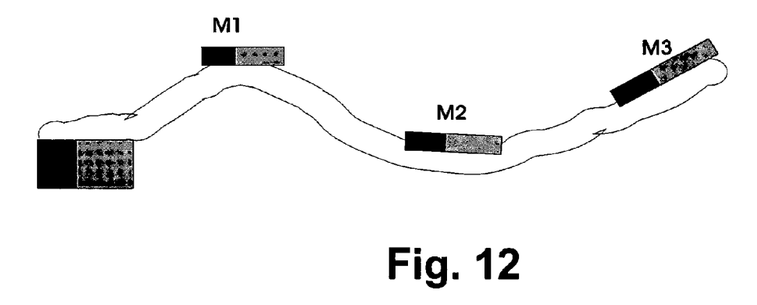
FIG. 12 illustrates the electro-mechanical transducer according to the embodiment depicted in FIG. 8 operating in a third resonant mode.

Frequency modulated voltage can be applied to the piezoelectric bar 610. As illustrated in FIG. 9, the electro-mechanical device is initially in a resting position. FIG. 10 illustrates a first resonant mode of the electro-mechanical device. FIG. 11 illustrates a second resonant mode of the electro-mechanical device. FIG. 12 illustrates a third resonant mode of the electro-mechanical device. The modes illustrated in FIGS. 7-10 will produce a resultant output having frequencies that are similar to the frequencies illustrated in FIG. 7 due to the superposition of the three resonant modes produced by the electro-mechanical device.

Figure 13:
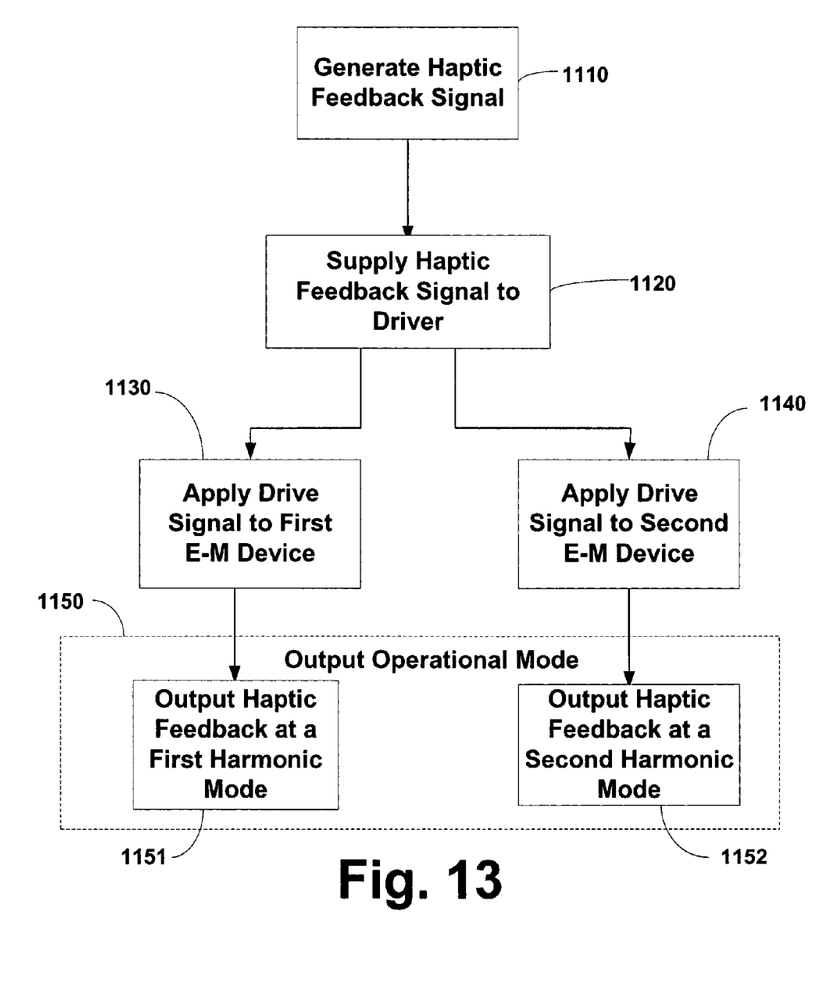
FIG. 13 is a flow chart illustrating a method for producing an operational mode of an electro-mechanical transducer according to an embodiment of the invention.

FIG. 13 illustrates a method for producing an operational mode of an electro-mechanical transducer, according to an embodiment of the invention. At step 1110, a haptic feedback signal is generated. At step 1120, the haptic feedback signal is supplied to a driver. At step 1130, the drive signal is then applied to a first electro-mechanical device. At step 1140, a drive signal is also applied to the second electro-mechanical device. At step 1150, the electro-mechanical devices output haptic feedback that includes haptic feedback at a first resonant mode (step 1151) and haptic feedback at a second resonant mode (step 1152). The output of haptic feedback at a first resonant mode by a first electro-mechanical device and/or at a second resonant mode by a second electro-mechanical device correspond to an operational mode of the electro-mechanical transducer having the first electro-mechanical device and/or the second electro-mechanical device, respectively.

Additional electro-mechanical devices can be added and can have the drive signal selectively applied thereto to collectively yield a variety of different operational modes of the electro-mechanical transducer. Alternatively, the electro-mechanical transducer may include multiple masses, as illustrated in FIG. 8. By altering the frequency of the drive signal such that it substantially corresponds to the resonant frequencies of the electro-mechanical device, the electro-mechanical transducer can output haptic feedback having multiple frequencies for a given operational mode.

In another embodiment, a number of electro-mechanical devices in a serial configuration, as illustrated in FIG. 8, can be arranged in parallel as illustrated in FIG. 5.

The devices described above are capable of being used in small, portable devices where energy consumption needs to be low. For example, electro-mechanical transducers can be used in cellular phones, electronic pagers, laptop touch pads, a cordless mouse or other computer peripherals whether cordless or otherwise, a personal digital assistant (PDA), along with a variety of other portable and non-portable devices.

While the particular embodiments of the invention were described above with respect to piezoelectric bars, the invention is not limited to the use of piezoelectric bars and piezoelectric devices having various structures can be used depending on the desired application of the electro-mechanical transducer. For example, the piezoelectric device can have a planar shape where the width is approximately the same as the length.

While particular embodiments of the invention have been described with reference to piezoelectric ceramics, numerous other electro-mechanical devices may be used to implement the invention. For example, the electro-mechanical devices according to the invention may include electro-active polymers (EAP), voice coil transducers or other electromagnetic device, or resonant eccentric rotating mass (HERM) devices.

While various embodiments of the invention have been described above, it should be understood that they have been presented by way of example only, and not limitation. Thus, the breadth and scope of the invention should not be limited by any of the above-described embodiments, but should be defined only in accordance with the following claims and their equivalence.

The previous description of the embodiments is provided to enable any person skilled in the art to make or use the invention. While various electro-mechanical transducers have been described including at least one electro-mechanical device including a piezoelectric substance, various other electro-mechanical devices may be utilized that can be configured to operate in multiple operational modes, each one of the multiple operational modes including a number of resonant modes. Other modifications to the overall structure of the electro-mechanical devices and arrangement of the selector-mechanical transducers can be made without departing from the spirit and scope of the invention.

What is claimed is:

1. A method, comprising:
    receiving a drive signal associated with a haptic feedback signal, the drive signal having operating at a predetermined drive frequency; and
    applying the drive signal to an electro-mechanical transducer to cause the transducer to produce a haptic effect, the electro-mechanical transducer operating in at least one resonant mode from a plurality of resonant modes in response to the predetermined drive frequency of the drive signal.

2. The method of claim 1, the electro-mechanical transducer being a first electro-mechanical device, the method further comprising:
    applying the drive signal to a second electro-mechanical device different from the first electro-mechanical device, the first electro-mechanical device and the second electro-mechanical device collectively operating in one operational mode from a plurality of operational modes in response to the drive signal for the first electro-mechanical device and the drive signal for the second electro-mechanical device.

3. The method of claim 1, the electro-mechanical transducer being a first electro-mechanical device, the method further comprising:
    applying the drive signal to a second electro-mechanical device different from the first electro-mechanical device, the first electro-mechanical device and the second electro-mechanical device collectively operating in one operational mode from a plurality of operational modes in response to the drive signal for the first electro-mechanical device and the drive signal for the second electro-mechanical device, the plurality of operational modes including a first operational mode and a second operational mode; and
    changing from the first operational mode to the second operational mode, at least one the resonant mode of first electro-mechanical device and the resonant mode of the second electro-mechanical device for the first operational mode differing for the second operational mode.

4. The method of claim 1, the electro-mechanical transducer being a first electro-mechanical device, further comprising:
    applying the drive signal to a second electro-mechanical device different from the first electro-mechanical device, the first electro-mechanical device and the second electro-mechanical device collectively operating in one operational mode from a plurality of operational modes in response to the drive signal for the first electro-mechanical device and the drive signal for the second electro-mechanical device,
    the first operational mode being associated with the applying the drive signal to the first electro-mechanical device when the drive signal to the second electro-mechanical device is not applied,
    the second operational mode being associated with the applying the drive signal to the second electro-mechanical device when the drive signal to the first electro-mechanical device is not applied.

5. A method, comprising:
    receiving a drive signal;
    applying the drive signal to a first electro-mechanical transducer, the electro-mechanical transducer having a plurality of operational modes in response to the drive signal, each operational mode from the plurality of operational modes having its own combination of at least one resonant mode from a plurality of resonant modes;
    applying the drive signal to a second electro-mechanical device different from the first electro-mechanical device, the second electro-mechanical device and the first electro-mechanical device collectively having the plurality of operational modes, the plurality of operational modes including a first operational mode and a second operational mode; and
    changing from the first operational mode to the second operational mode by altering a characteristic of the drive signal.

6. The method of claim 5, the electro-mechanical transducer being a first electro-mechanical device, the plurality of operational modes including a first operational mode and a second operational mode, the drive signal being associated with the first operational mode, the method further comprising:
    applying the drive signal to a second electro-mechanical device different from the first electro-mechanical device, the second electro-mechanical device and the first electro-mechanical device collectively having the plurality of operational modes.

7. The method of claim 5, the plurality of operational modes including a first operational mode and a second operational mode, the drive signal being associated with the first operational mode, the method further comprising:
    changing from the first operational mode to the second operational mode by altering a characteristic of the drive signal.

8. An apparatus, comprising:
    a signal source, the signal source being configured to output a haptic feedback signal;
    a driver, the driver being configured to receive the haptic feedback signal and output a drive signal having a predetermined drive frequency; and
    an electro-mechanical transducer being configured to receive the drive signal, the electro-mechanical transducer being operative in a plurality of operational modes, each operational mode from the plurality of operational modes having at least one resonant mode from a plurality of resonant modes, wherein the electro-mechanical transducer outputs a haptic effect in the at least one resonant mode in response to the predetermined drive frequency.

9. The apparatus of claim 8, wherein the electro-mechanical transducer is a piezoelectric transducer.

10. The apparatus of claim 8, wherein the electro-mechanical transducer is an electro-active polymer.

11. The apparatus of claim 8, the electro-mechanical transducer being a first electro-mechanical device, the apparatus further comprising:

a second electro-mechanical device different from the first electro-mechanical device, the second electro-mechanical device being configured to receive the drive signal, the plurality of operational modes being associated with the first electro-mechanical transducer and the second electro-mechanical transducer collectively.

12. A handheld communication device comprising:

a cantilevered transducer being configured to receive a drive signal, the cantilevered transducer being operative in a plurality of operational modes, each operational mode from the plurality of operational modes having at least one resonant mode from a plurality of resonant modes, wherein the electro-mechanical transducer outputs a haptic effect in the at least one resonant mode in response to the predetermined drive frequency.

13. A method of producing a haptic effect in a handheld communication device, the method comprising:

providing a cantilevered transducer having a first fixed end and a second end which is flexibly moveable with respect to the first fixed end, the transducer having a mass fixed thereon a predetermined length from the first end;

receiving a drive signal associated with a haptic feedback signal, the drive signal having operating at a drive frequency; and applying the drive signal to the transducer to produce a haptic effect, the electro-mechanical transducer operating in at least one resonant mode from a plurality of resonant modes in response to the drive frequency of the drive signal.

* * * * *